(12) United States Patent
Mitsumori et al.

(10) Patent No.: US 6,629,540 B2
(45) Date of Patent: Oct. 7, 2003

(54) WET TREATMENT APPARATUS

(75) Inventors: Kenichi Mitsumori, Miyagi-ken (JP); Tadahiro Ohmi, 2-1-17-301 Komegafukuro, Aoba-ku, Sendai-shi, Miyagi-ken (JP)

(73) Assignees: Alps Electric Co., Ltd., Tokyo (JP); Tadahiro Ohmi, Tokyo (JP)

( * ) Notice: Subject to any disclaimer, the term of this patent is extended or adjusted under 35 U.S.C. 154(b) by 201 days.

(21) Appl. No.: 09/945,531

(22) Filed: Aug. 30, 2001

(65) Prior Publication Data

US 2002/0023671 A1 Feb. 28, 2002

(30) Foreign Application Priority Data

Aug. 30, 2000  (JP) ........................................ 2000-261949

(51) Int. Cl.$^7$ ................................................. B08B 5/04
(52) U.S. Cl. .................. 134/122 R; 134/198; 134/172; 134/64 R; 134/184; 15/320
(58) Field of Search ............................. 134/64 P, 64 R, 134/122 P, 122 R, 198, 172, 184; 15/302, 320, 321; 68/19, 19.1, 20

(56) References Cited

U.S. PATENT DOCUMENTS

| | | | |
|---|---|---|---|
| 3,461,843 A | * | 8/1969 | Noon |
| 3,574,261 A | * | 4/1971 | Bailey |
| 3,801,387 A | * | 4/1974 | Gofferdo et al. |
| 4,842,000 A | * | 6/1989 | Malashenko |
| 4,949,424 A | * | 8/1990 | Shero |
| 5,293,663 A | * | 3/1994 | McCullough |
| 5,335,681 A | * | 8/1994 | Schmid |
| 5,381,580 A | * | 1/1995 | Kotitschke et al. |
| 5,614,264 A | * | 3/1997 | Himes |
| 5,758,520 A | * | 6/1998 | Hirano et al. |
| 5,927,306 A | | 7/1999 | Izumi et al. |
| 6,059,919 A | | 5/2000 | Schneider et al. |
| 6,176,245 B1 | * | 1/2001 | Takahashi et al. |
| 6,457,335 B1 | * | 10/2002 | Fleissner |

FOREIGN PATENT DOCUMENTS

| DE | 3404125 | * | 8/1985 |
|---|---|---|---|
| DE | 41 07 854 A 1 | | 9/1992 |
| EP | 0 603 008 A1 | | 6/1994 |

OTHER PUBLICATIONS

"Advanced Wet Cleaning Using Novel Nozzle and Functional Ultrapure Water in Next Generation FPD/LSI Manufacturing;" Ken–ichi Mitsumori et al; "Proceedings of the Ninth International Symposium on Semiconductor Manufacturing;" ISSM 2000—Annual Forum for the Discussion of Improvement in Semiconductor Manufacturing; Sep. 26–28, 2000.

* cited by examiner

Primary Examiner—Frankie L. Stinson
(74) Attorney, Agent, or Firm—Brinks Hofer Gilson & Lione

(57) ABSTRACT

A wet treatment apparatus includes a nozzle having an approximately rectangular introduction opening surface that is open toward a substrate to be treated and an approximately rectangular recovery opening surface that is open toward the substrate, these opening surfaces being flush with each other and disposed with the long side directions thereof in parallel with each other. A treatment liquid is introduced between the introduction opening surface and the surface to be treated of the substrate and is sucked and recovered from between the recovery opening surface and the surface to be treated of the substrate. The flow rate of the treatment liquid flowing from the introduction opening surface to the recovery opening surface through the surface to be treated of the substrate is controlled to 0.02 to 0.3 L/min per 1 cm in the long side direction of the introduction opening surface. With this arrangement, there can be provided a wet treatment apparatus capable of using a liquid saving type nozzle under optimum conditions.

9 Claims, 10 Drawing Sheets

WET TREATMENT APPARATUS

BACKGROUND OF THE INVENTION

1. Field of the Invention

The present invention relates to a wet treatment apparatus for feeding a treatment liquid onto a workpiece to be treated at a wet treatment step, such as a cleaning step, an etching step, and the like, in a process for manufacturing, for example, a semiconductor device, a liquid crystal panel, and the like.

2. Description of the Related Art

In the field of electronic devices, such as semiconductor devices, liquid crystal display panels, and the like, a step for cleaning a semiconductor substrate and a glass substrate (acting as the workpiece to be treated) is indispensable in the manufacturing process thereof. During the cleaning step, the substrate is cleaned with ultrapure water, electrolyte, ozone water, hydrogen gas dissolved water, and the like to remove various substances therefrom in the manufacturing process. These cleaning liquids are typically fed onto the substrate from the nozzle of a cleaning apparatus. However, when a conventional cleaning nozzle is used, an excess amount of cleaning liquid is often used. For example, when trying to achieve a degree of cleanness of about 0.5 piece/cm$^2$ of particles remaining on a substrate of 500 mm square by cleaning the substrate with a cleaning liquid such as electrolyte or the like, and then rinsing it with a rinsing liquid, the cleaning liquid and the rinsing liquid must each be conventionally used in an amount of 25 to 30 L/min.

In an attempt to overcome the above problem, there has been developed a liquid saving type cleaning wet treatment nozzle capable of reducing the amount of cleaning liquid to be used as compared with conventional types of cleaning nozzles. This wet treatment nozzle is used when a substrate to be treated is subjected to wet treatment by feeding a treatment liquid onto the substrate. The wet treatment nozzle includes a treatment liquid introduction path formed at an end, an introduction port for introducing a treatment liquid, a treatment liquid discharge path formed at an end, and a discharge port for discharging the treatment liquid after it is used. An introduction opening and a discharge opening are formed at the other ends of the introduction path and the discharge path, respectively, and open toward the substrate to be treated.

The wet treatment nozzle device as described above also includes a suck and discharge unit for sucking and discharging the treatment liquid that has been in contact with the substrate to be treated after treatment through the discharge path by controlling the pressure difference between the pressure of the treatment liquid in contact with the substrate to be treated and the atmospheric pressure so as to prevent the treatment liquid from flowing to the outside of the discharge path.

The wet treatment apparatus having the above wet treatment nozzle may also have a nozzle or substrate having moving unit for treating the entire region of the surface of the substrate to be treated by relatively moving the wet treatment nozzle along the surface to be treated.

That is, according to the wet treatment apparatus as described above, a liquid saving type nozzle can be utilized that can remove a treatment liquid from the substrate to be treated without causing the treatment liquid to come into contact with any portion other than the portion to which the treatment liquid is directed. Further, the provision of a moving unit for relatively moving the wet treatment nozzle and the substrate to be treated along the surface to be treated of the substrate permits the entire region of the substrate to be subjected to the treatment.

As described above, there have been developed wet treatment apparatuses capable of cleaning the entire surface of a substrate to be treated while reducing the quantity of treatment liquid used. However, the condition under which these wet treatment apparatuses are actually used have not been examined sufficiently.

That is, while it is true that wet treatment apparatuses have been developed as liquid saving type wet treatment apparatuses, the conditions under which they are actually used, such as the flow rate of a treatment liquid for optimizing treatment, an optimum relative moving speed between the substrate to be treated and the wet treatment nozzle, and so on, have only been approximated through trial and error. Thus, not only is a long time needed to determine the conditions under which the wet treatment apparatuses are optimally used, but it is likely that the wet treatment apparatuses are not used under optimum conditions.

SUMMARY OF THE INVENTION

An object of the present invention, which was made to solve the above problems, is to identify the appropriate conditions under which a liquid saving type wet treatment apparatus as described above is used, and to provide a wet treatment apparatus capable of being used under optimum conditions, to thereby realize effective and efficient wet treatment.

To solve the above problems, the flow rate was first examined. An optimum flow rate is determined from the condition wherein the treatment liquid uniformly flows from an introduction opening surface to a recovery opening surface, and wherein the wet treatment process can be sufficiently executed with the flow rate. Then, it was necessary to examine an optimum flow rate per unit length in a direction perpendicular to the relatively moving direction of a wet treatment nozzle and a workpiece to be treated, and the value of the optimum flow rate was determined by experimentation.

That is, a wet treatment apparatus according to the present invention includes a nozzle having an approximately rectangular introduction opening surface, which is open toward a workpiece to be treated, and an approximately rectangular recovery opening surface, which is also open toward the workpiece to be treated. The introduction opening surface and the recovery opening surface are flush with each other and are disposed with the long side directions thereof in parallel with each other. The present invention also includes a treatment liquid introduction unit having an introduction flow path for introducing a treatment liquid between the introduction opening surface and the surface to be treated, a treatment liquid recovery unit having a suction pump and a recovery flow path for sucking and recovering the treatment liquid from between the recovery opening surface and the surface to be treated, and a moving unit for relatively moving the nozzle and the workpiece to be treated along the surface to be treated as well as in the short side directions of the introduction opening surface and the recovery opening surface. Wherein the flow rate of the treatment liquid flowing from the introduction opening surface to the recovery opening surface through the surface to be treated of the workpiece to be treated is controlled to 0.02 to 0.3 L/min per 1 cm in the long side direction of the introduction opening surface.

That is, when the flow rate is less than 0.02 L/min, the treatment liquid cannot be sufficiently distributed to the surface to be treated of the workpiece, and also cannot be sufficiently replaced. In contrast, when the flow rate is greater than 0.3 L/min, an excessive treatment liquid flows to the outside of the surface to be treated, and the stable flow of the treatment liquid on the surface to be treated is disturbed, whereby the treatment liquid is likewise insufficiently replaced.

According to the present invention, the treatment liquid is sufficiently distributed to the surface to be treated of the workpiece and is sufficiently replaced. In addition, an excessive treatment liquid does not flow to the outside of the surface to be treated. Therefore, the wet treatment of the workpiece can be effectively executed.

Further, since the wet treatment can be executed with a small amount of treatment liquid, the size of piping, valves, an apparatus for manufacturing and delivering the treatment liquid, such as pure water, etc., can be reduced, and the size of a wet treatment apparatus can likewise be reduced, thereby decreasing treatment costs.

In the present invention, the flow rate can be controlled by regulating the sectional area of the introduction flow path and/or the recovery flow path. As a method of controlling the sectional area of each flow path, the present inventions employs a method of disposing a regulator valve in a midway of the piping for forming the flow path, a method of switching a flow path having a large sectional area and a flow path having a small sectional area, or the like. A method of using a fluid mass flow controller and the like can also be appropriately employed as another flow rate control method.

In the present invention, it is preferable that the lengths of the long sides of the introduction opening surface and the recovery opening surface be equal to or larger than the width, which is in the direction parallel to the long sides, of the workpiece to be treated. This allows the entire surface of the workpiece to be treated by relatively moving the nozzle and the workpiece with the moving unit only once in one direction. Therefore, the time for treating the overall workpiece can be reduced.

In the present invention, it is preferable to set a relative moving speed due to the moving unit to 0.5 to 20 cm/sec. When the moving speed is less than 0.5 cm/sec, the time for treating the overall surface to be treated is increased wastefully. Moreover, when bubbles are generated during treatment, they are deposited on the surface to be treated and the surface cannot be sufficiently treated.

In contrast, when the moving speed is greater than 20 cm/sec, a treatment liquid layer on the surface to be treated is broken by a shear force that is generated thereby, and the surface cannot be sufficiently treated during the treatment. In addition, problems such as an increase in vibration of the treatment apparatus and the like are liable to occur.

In the present invention, it is preferable that the distance between the respective opening surfaces and the surface to be treated of the workpiece be 0.5 to 6 mm. When this distance is less than 0.5 mm, a resistance that is necessary for the treatment liquid to move is increased excessively. Moreover, it is difficult to secure the flow rate of 0.02 to 0.3 L/min per 1 cm in the long side direction of the introduction opening surface. Further, contact of the nozzle with the workpiece is liable to be caused by the vibration of the treatment apparatus.

In contrast, when the distance is greater than 6 mm, it is difficult to keep the treatment liquid between the respective opening surfaces and the surface to be treated, and air is liable to flow therebetween. Thus, it is difficult to stably flow the treatment liquid between the nozzle and the workpiece, and as a result, a portion may not be treated.

In the present invention, it is preferable that the short sides of the respective opening surfaces have a length of 0.01 to 2 cm. When the short sides of the respective opening surfaces are less than 0.01 cm, the resistance that is necessary for the treatment liquid to move is increased excessively, and it is difficult to secure a flow rate of 0.02 to 0.3 L/min per 1 cm in the long side direction of the introduction opening surface.

In contrast, when the short sides of the respective opening surfaces are greater than 2 cm, the treatment liquid cannot be uniformly fed from the introduction opening surface to the surface to be treated, and the treatment liquid on the surface to be treated cannot be uniformly recovered from the recovery opening surface, whereby the flow rate of the treatment liquid on the surface to be treated becomes uneven.

In the present invention, an ultrasonic oscillation application unit may be interposed between the introduction opening surface and the recovery opening surface to apply ultrasonic oscillation to the treatment liquid on the workpiece. In this case, ultrasonic oscillation can be applied to the treatment liquid on the surface to be treated, whereby the efficiency of a wet treatment process such as cleaning and the like can be improved.

In the present invention, an oxidation-reduction potential controller and a pH controller may be provided for the treatment liquid. In this case, since the composition and the concentration of the treatment liquid can be optimally maintained, a sufficient treatment efficiency can be secured even if the flow rate has a small value.

DESCRIPTION OF THE PREFERRED EMBODIMENTS

First Embodiment

A first embodiment of the present invention will be described below with reference to FIGS. 1 to 10.

Figure 1:
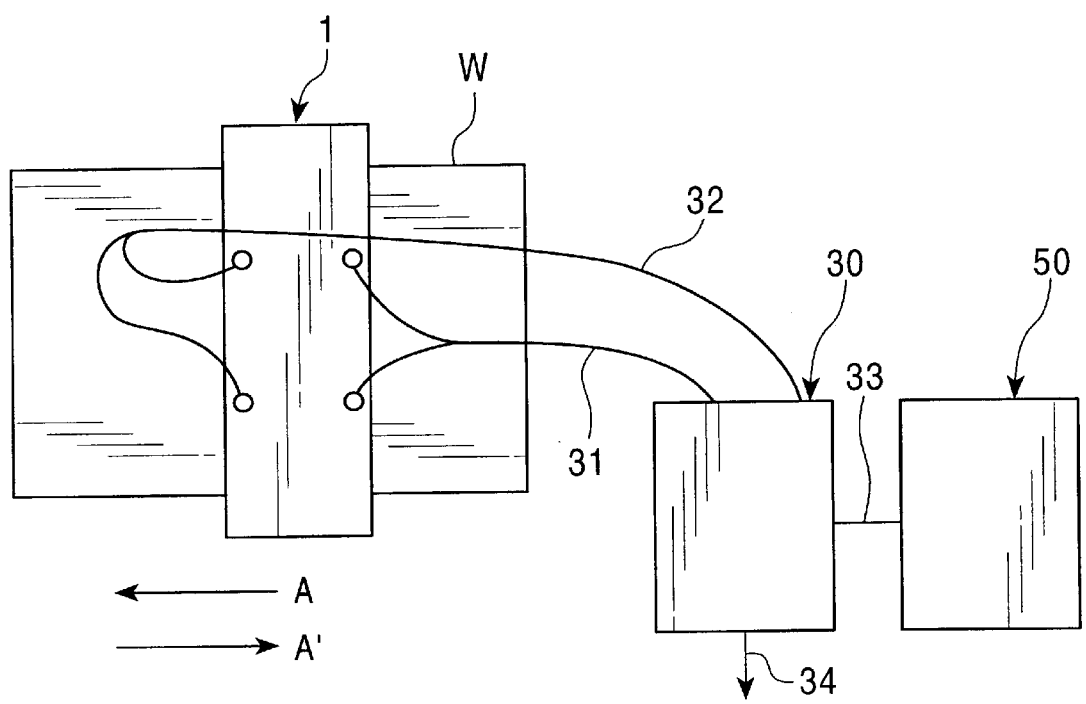
FIG. 1 is a plan view showing the overall arrangement of a wet treatment apparatus according to an embodiment of the present invention.

FIG. 1 is a plan view showing the overall arrangement of a cleaning apparatus (wet treatment apparatus) of this embodiment. As shown in FIG. 1, the cleaning apparatus of this embodiment is composed of a cleaning nozzle 1, a moving unit (not shown) for moving the cleaning nozzle 1 and a substrate W to be treated (hereinafter, simply referred to as "substrate"), acting as a workpiece to be treated in a moving direction A or A', a cleaning liquid introduction/recovery unit 30, and a cleaning liquid preparation unit 50.

In FIG. 1, reference numeral 31 denotes the introduction flow path of the cleaning liquid introduction/recovery unit 30 with one end thereof divided into two flow paths connected to the cleaning nozzle 1. Further, reference numeral 32 denotes the recovery flow path of the cleaning liquid introduction/recovery unit 30 with one end thereof also divided into two flow paths connected to the cleaning nozzle 1.

Reference numeral 33 denotes a feed flow path from the cleaning liquid preparation unit 50 to the cleaning liquid introduction/recovery unit 30. Further, reference numeral 34 denotes the discharge flow path of the cleaning liquid introduction/recovery unit 30.

Figure 2:
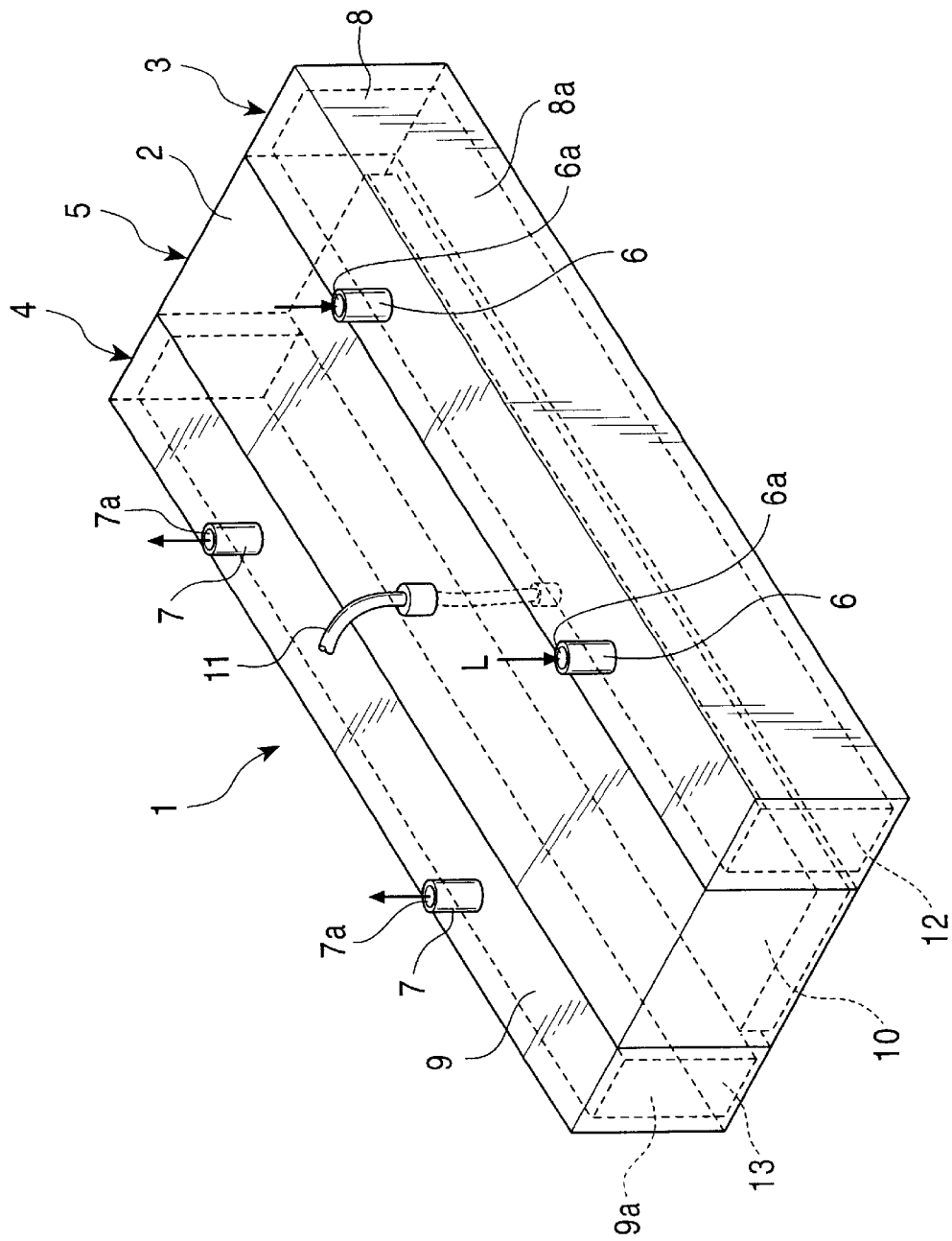
FIG. 2 is perspective view showing the outward appearance of a cleaning nozzle of a first embodiment of the present invention.
Figure 3:
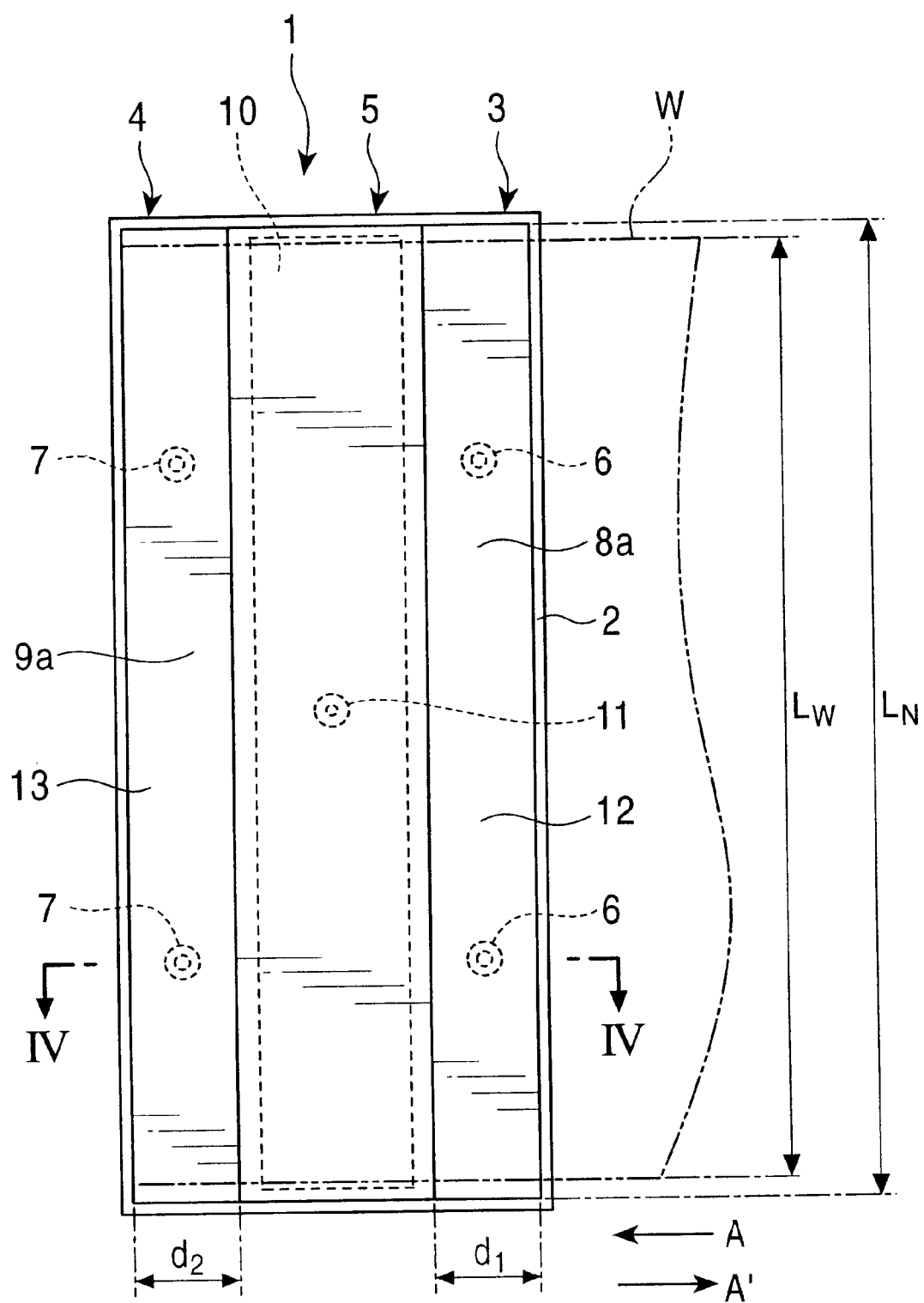
FIG. 3 is a lower plan view of the cleaning nozzle.
Figure 4:
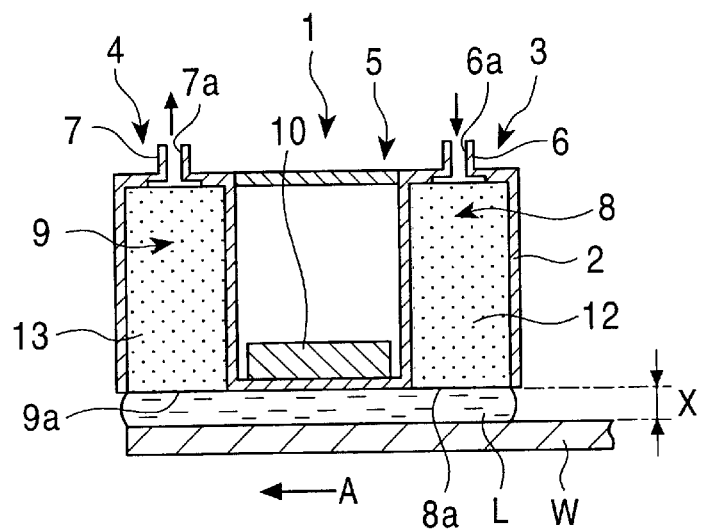
FIG. 4 is a sectional view taken along the line IV—IV of FIG. 3.

As shown in FIGS. 2 to 4, in the cleaning nozzle 1 of this embodiment, a casing 2 is divided into three regions along its short side direction. The regions at the ends of the casings are arranged as a cleaning liquid introducing section 3 and a cleaning liquid recovery section 4, respectively. The central region is arranged as an ultrasonic oscillator accommodating section 5.

Two cleaning liquid introduction pipes 6 and 6 are disposed on the upper surface of the cleaning liquid introducing section 3, and are spaced apart from each other in the long side direction of the nozzle 1. Similarly, two cleaning liquid recovery pipes 7 and 7 are disposed on the upper surface of the cleaning liquid recovery section 4.

The upper ends of the respective cleaning liquid introduction pipes 6 are open and arranged as introduction ports 6a and 6a through which a cleaning liquid (treatment liquid) L is introduced, and the introduction flow path 31 of FIG. 1 is connected to the introduction ports 6a and 6a. Similarly, the upper ends of the respective cleaning liquid recovery pipes 7 are open and arranged as recovery ports 7a and 7a from which the cleaning liquid L is recovered to the outside of the cleaning nozzle 1 after it is used, and the recovery flow path 32 of FIG. 1 is connected to the recovery ports 7a and 7a.

The interior of the cleaning liquid introducing section 3 is arranged as an introduction opening 8 communicating with the cleaning liquid introduction pipes 6 and 6, and the lower end thereof is arranged as an introduction opening surface 8a that is open toward the substrate W. The introduction opening surface 8a is formed in an approximate rectangle with its long side having a length $L_N$ and its short side having a length $d_1$ (See FIG. 3).

In the same way, the interior of the cleaning liquid recovery section 4 is arranged as a recovery opening 9, and the lower end thereof is arranged as a recovery opening surface 9a that is open toward the substrate W. The introduction opening surface 9a is formed in an approximate rectangle with its long side having a length $L_N$ and its short side having a length $d_2$ (See FIG. 3).

The introduction opening surface 8a and the recovery opening surface 9a are flush (i.e., are in the same plane) with each other, as well as disposed with the long side directions thereof in parallel to each other. In addition, the introduction opening surface 8a and the recovery opening surface 9a are formed such that the long sides thereof have the same length $L_N$, and the short sides $d_1$ and $d_2$, respectively, have approximately the same length. Further, the length $L_N$ of these long sides is formed similar to or somewhat longer than the width $L_W$ of the substrate W. The lengths of the lengths $d_1$ and $d_2$ of the short sides are each set to 0.01 to 2 cm, respectively, in this embodiment.

It should be noted that the substrate W may be moved in the direction A (from right to left of FIG. 3) in parallel with the respective short sides, or in the direction A' (opposite to the direction A).

Further, an ultrasonic oscillator 10 (e.g., an ultrasonic oscillation application unit) is accommodated in the interior of the ultrasonic oscillator accommodating section 5 to execute ultrasonic cleaning by applying ultrasonic oscillation to the cleaning liquid L. A cable 11 for driving the ultrasonic oscillator 10 is disposed at the center of the ultrasonic oscillator accommodating section 5.

As shown in FIG. 4, a cleaning liquid feed member 12 (treatment liquid feed member) composed of a porous material is disposed within the interior of the introduction opening 8, with the introduction opening surface 8a acting as the lower end surface thereof. The cleaning liquid feed member 12 comprises a porous material such as, for example, a plastic such as fluorine resin, polyethylene, etc., a metal such as SUS 316, etc., a ceramic such as alumina, silicon oxide, etc., a plastic subjected to a hydrophilic treatment so as to provide its surface with a hydrophilic group, a metal oxide such as $TiO_2$, and so on. Among these materials, hydrophilic materials such as the silicon oxide, alumina, a plastic subjected to a hydrophilic treatment, etc., are preferable. However, it is not necessary to form the cleaning liquid feed member 12 of a hydrophilic material in its entirety, but only the portion of the cleaning liquid feed member 12 which is in contact with the cleaning liquid L on the substrate W. Alternatively, the surface of the cleaning liquid feed member 12 may be subjected to hydrophilic treatment. In any of these constructions, when the cleaning liquid L is fed into the introduction opening 8 through the cleaning liquid introduction pipes 6, the cleaning liquid L can be uniformly fed onto the substrate W through a multiplicity of through holes in the cleaning liquid feed member 12. This is because the cleaning liquid feed member 12 is formed of a porous material.

A cleaning liquid recovery member (treatment liquid recovery member) 13, which is also formed of a porous material, is disposed within the interior of the recovery opening 9, with the recovery opening surface 9a acting as the lower end surface thereof. The porous material used for the cleaning liquid recovery member 13 may be similar to that used for the cleaning liquid feed member 12. Either the same type or a different type of a porous material may be used for the cleaning liquid supply member 12 and for the cleaning liquid recovery member 13. Since the cleaning liquid recovery member 13 is formed of a porous material, the cleaning liquid L remaining on the substrate W after it is used is sucked by a multiplicity of through holes of the cleaning liquid recovery member 13 and recovered to the outside of the nozzle 1 through the cleaning liquid recovery pipes 7.

The introduction opening surface 8a, the lower surface of the ultrasonic oscillator accommodating section 5, and the recovery opening surface 9a are formed so as to be flush with each other (i.e., in the same plane). The distance between these surfaces and the surface to be cleaned (surface to be treated) of the substrate W is set to 0.5 to 6 mm in this embodiment.

Figure 5:
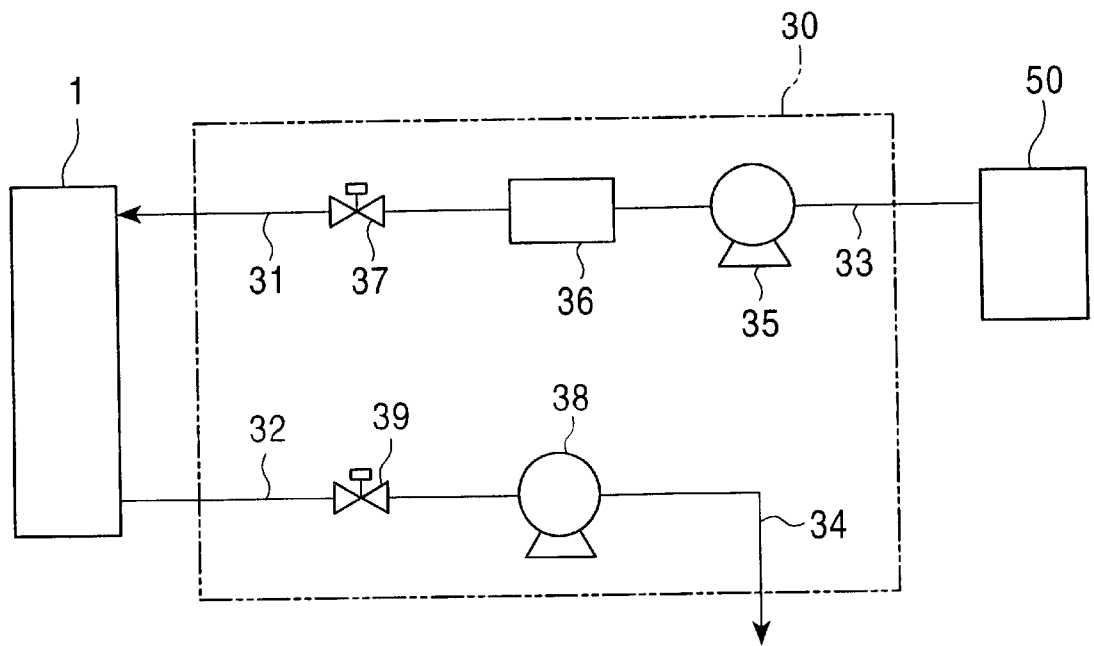
FIG. 5 is a view explaining a cleaning liquid introduction unit of the wet treatment apparatus according to the embodiment of the present invention.

Next, the arrangement of the cleaning liquid introduction/recovery unit 30 of this embodiment will be described with respect to FIG. 5. As shown in FIG. 5, a liquid feed pump 35, a liquid pressure controller 36 composed of a pressure reduction control valve and the like, and a regulator valve (flow rate controller) 37 are sequentially disposed in the introduction flow path 31 from the feed flow path 33 side. The cleaning liquid introduction unit (treatment liquid introduction unit) is composed of the feed flow path 33, the liquid feed pump 35, the liquid pressure controller 36, the regulation valve 37, and the introduction flow path 31. The operation of the liquid feed pump 35 causes the cleaning liquid L, which has been prepared with the cleaning liquid preparation unit 50, to be introduced into the cleaning nozzle 1. It should be noted that when the cleaning liquid L from the cleaning liquid preparation unit 50 has a sufficient pressure, the liquid feed pump 35 may be omitted.

A suction pump 38 and a regulator valve (flow rate controller) 39 are sequentially disposed in the recovery flow path 32 from the discharge flow path 34 side. The cleaning liquid recovery unit (treatment liquid recovery unit) is composed of the discharge flow path 34, the suction pump 38, the regulator valve 39, and the recovery flow path 32. The operation of the suction pump 38 causes the cleaning liquid L to be recovered and discharged from the cleaning nozzle 1.

The liquid pressure controller 36 controls the pressure difference between the pressure of the cleaning liquid L, which is kept between the cleaning nozzle 1 and the surface to be cleaned of the substrate W, and the atmospheric pressure by regulating the suction force of the suction pump 38 to thereby reliably recover the cleaning liquid L.

Further, the regulator valves 37 and 39 control the flow rate of the cleaning liquid L, which is introduced into the cleaning nozzle 1 and recovered, to 0.02 to 0.3 L/min per 1 cm of the long side of the introduction opening surface 8a, by regulating the sectional areas of the introduction flow path 31 and the recovery flow path 32.

Figure 6:
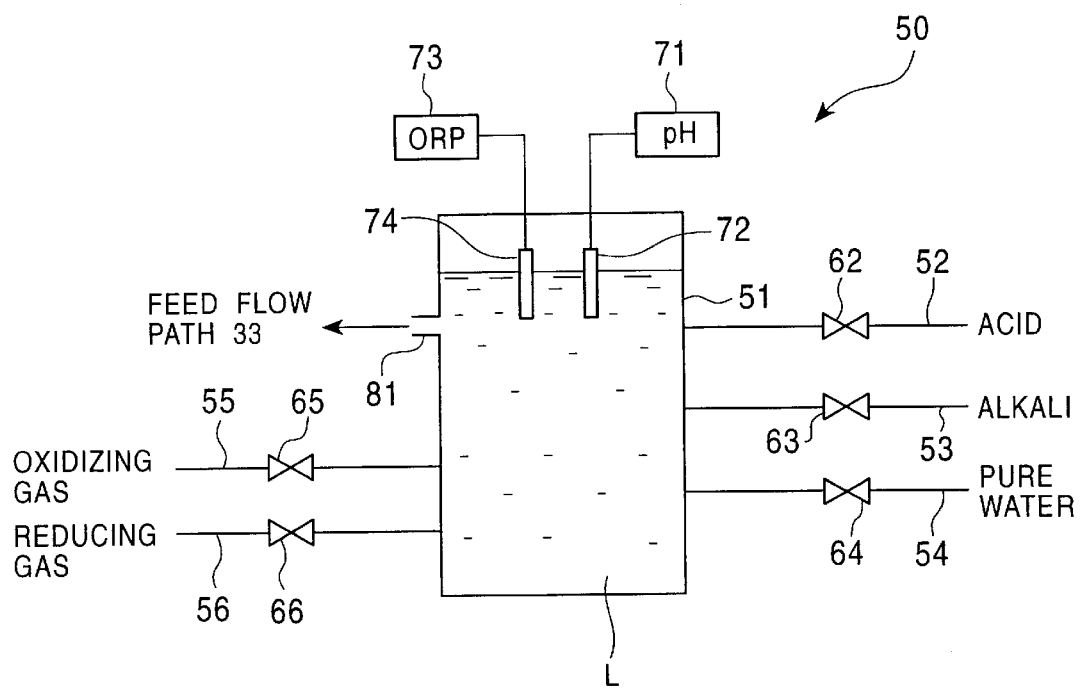
FIG. 6 is a view explaining a cleaning liquid preparation unit of the wet treatment apparatus according to the embodiment of the present invention.

Next, the arrangement of the cleaning liquid preparation unit 50 of this embodiment will be described with respect to FIG. 6. In FIG. 6, reference numeral 51 denotes a mixing bath to which feed pipes are connected. The feed pipes are composed of various types of materials depending upon the type of cleaning liquid L being used. Specifically, reference numeral 52 denotes an acid feed pipe, reference numeral 53 denotes an alkali feed pipe, reference numeral 54 denotes a pure water feed pipe, reference numeral 55 denotes an oxidizing gas feed pipe, and reference numeral 56 denotes a reducing gas feed pipe. Further, as shown in FIG. 6, the respective pipes 52 to 56 are provided with open/close valves 62 to 66, respectively, the opening and closing of which are controlled by a controller (not shown).

Further, a sensor 72 of a pH measuring instrument 71, and a sensor 74 of an oxidation-reduction potential measuring instrument 73, are dipped into the cleaning liquid L in the mixing bath 51, and the output values therefrom are supplied to the controller.

The controller controls the opening/closing of the open/close valves 62 and 63 based on the output value from the pH measuring instrument 71, and controls the opening/closing of the open/close valves 65 and 66 based on the output value from the oxidation-reduction potential measuring instrument 73. As a result, the cleaning liquid L, to which a desired pH and a desired oxidation-reduction potential is applied, can be prepared in the mixing bath 51 (pH control unit and oxidation-reduction potential control unit).

The aforementioned feed flow path 33 is connected to the mixing bath outlet 81 of the mixing bath 51, and the prepared cleaning liquid L is thereby introduced into the cleaning nozzle 1 through the cleaning liquid introduction/recovery unit 30 by operating the liquid feed pump 35 as described above.

Next, an example of the operation (sequence) of the cleaning apparatus arranged as described above will be described with respect to FIGS. 7 to 10.

Figure 7:
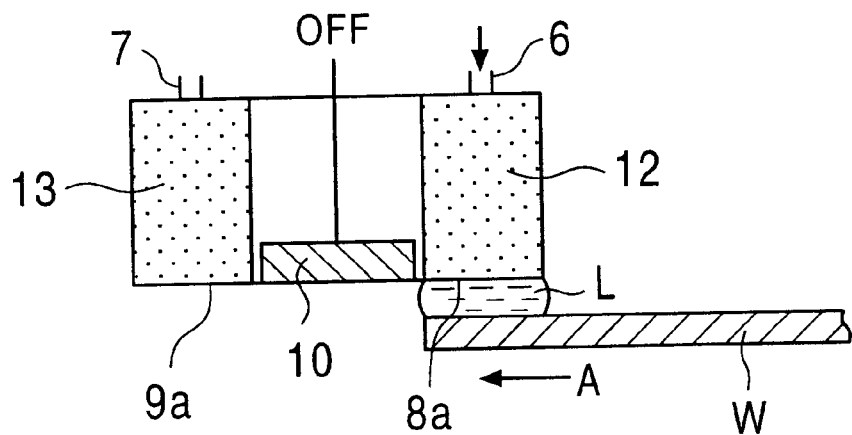
FIG. 7 is a view explaining an operation of the wet treatment apparatus according to the embodiment of the present invention.

In this example, the substrate W is moved by a moving unit (not shown) in the moving direction A shown in FIGS. 2 to 10 at a flow velocity of 0.5 to 20 cm/sec. First, the liquid feed pump 35 is operated at the time the left end of the substrate W arrives below the cleaning liquid feed member 12, the lower end surface of which is composed of the introduction opening surface 8a as shown in FIG. 7. Then, the cleaning liquid L is fed from the cleaning liquid feed member 12 onto the substrate W. At this time, the ultrasonic oscillator 10 is not yet put into operation.

Figure 8:
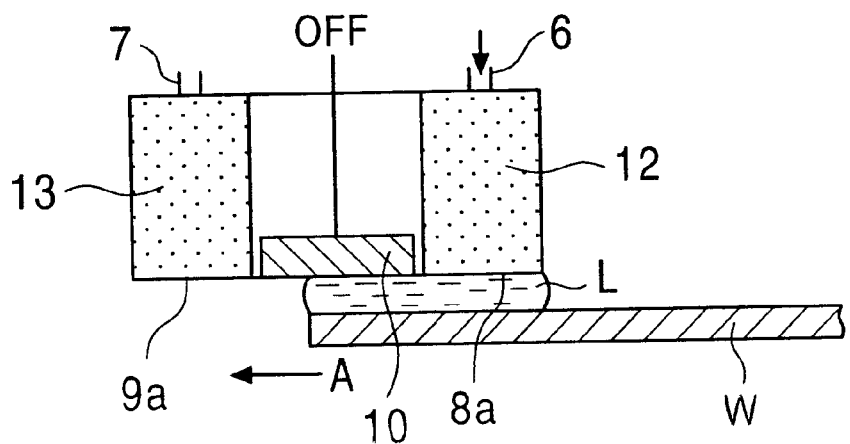
FIG. 8 is a view explaining an operation of the wet treatment apparatus according to the embodiment of the present invention.

When the substrate W is further moved, and while the cleaning liquid L flows below the ultrasonic oscillator 10 as shown in FIG. 8, the ultrasonic oscillator 10 is still not yet operated.

Figure 9:
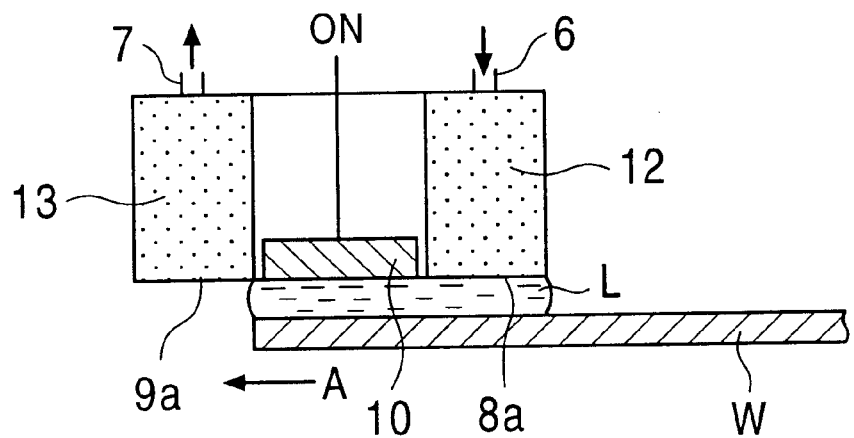
FIG. 9 is a view explaining an operation of the wet treatment apparatus according to the embodiment of the present invention.

When the substrate W is further moved and arrives below the cleaning liquid recovery member 13, the lower end surface of which is composed of the recovery opening surface 9a as shown in FIG. 9, the suction pump 38 is operated so that the cleaning liquid L, which has been fed onto the substrate W from the cleaning liquid feed member 12, is recovered from the cleaning liquid recovery member 13. At this step, since the cleaning liquid L steadily flows on the substrate W, the substrate W is cleaned with ultrasonic oscillation by operating the ultrasonic oscillator 10 simultaneously with the flow of the cleaning liquid L.

At this time, the regulator valves 37 and 39 are regulated so that the steady flow rate of the cleaning liquid L, which flows from the introduction opening surface 8a to the recovery opening surface 9a through the surface to be treated of the substrate W, is set to 0.02 to 0.3 L/min per 1 cm in the long side direction of the introduction opening surface 8a.

Figure 10:
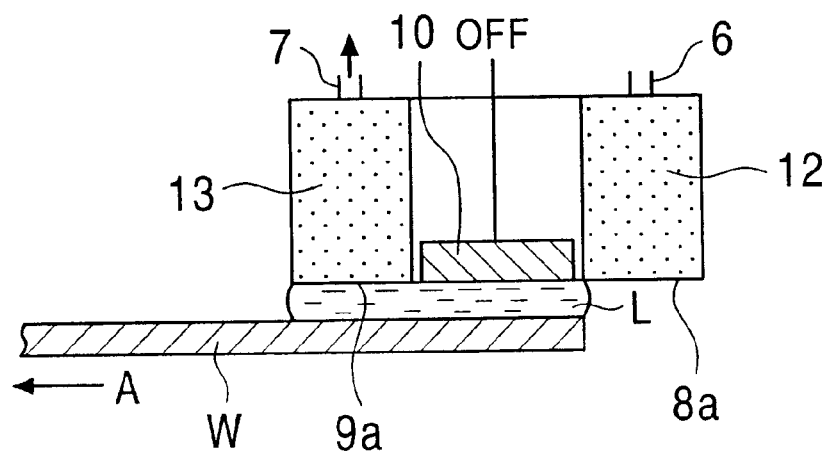
FIG. 10 is a view explaining an operation of the wet treatment apparatus according to the embodiment of the present invention.

Finally, when the right end of the substrate W has passed below the cleaning liquid feed member 12 as shown in FIG. 10, the operation of the liquid feed pump 35 is stopped so as to stop the feed of the cleaning liquid L. The operation of the ultrasonic oscillator 10 is also stopped at this time. Finally, the cleaning liquid L remaining on the substrate W is recovered through the cleaning liquid recovery member 13. By the method described above, the movement of the substrate W from the right to the left in FIGS. 7 to 10 with respect to the cleaning nozzle 1 permits the entire region of the upper surface of the substrate W to be cleaned with ultrasonic oscillation.

In the cleaning apparatus of this embodiment, the flow rate of the treatment liquid, which flows from the introduction opening surface to the recovery opening surface through the surface to be treated of the substrate W is controlled to 0.02 to 0.3 L/min per 1 cm in the long side direction of the introduction opening surface. This enables the cleaning liquid to be sufficiently distributed to the entire surface to be treated of the substrate W, and to flow stably. In addition, approximately the entire quantity of the cleaning liquid can be recovered.

Further, since the length $L_N$ of the long side of the introduction opening surface 8a is equal to or somewhat larger than the width $L_W$ of the substrate W, the entire region of the surface to be treated of the substrate W can be cleaned by moving the substrate W only once in one direction with respect to the cleaning nozzle 1.

Further, since the moving speed of the substrate W moved by the moving unit is set to 0.5 to 20 cm/sec in this embodiment, the adhesion of bubbles or the breakage of the treatment liquid layer is prevented so that the entire surface to be treated can be sufficiently treated in a short time.

Further, since the distance between the introduction opening surface 8a and recovery opening surface 9a of the cleaning nozzle 1 and the surface to be treated of the substrate W is set to 0.5 to 6 mm, the flow rate of 0.02 to 0.3 L/min can be easily maintained and the flow of the treatment liquid can be stabilized. Further, the contact of the nozzle 1 with the substrate W due to the vibration of the treatment apparatus can be prevented.

Further, in this embodiment, since the lengths of the respective short sides of the introduction opening surface 8a and the recovery opening surface 9a of the cleaning nozzle 1 are each set to 0.01 to 2 cm, the flow rate of the cleaning liquid L of 0.02 to 0.3 L/min can be easily secured. In addition, it is also easy to uniformly feed the cleaning liquid L from the introduction opening surface 8a to the surface to be treated of the substrate W, and to uniformly recover the cleaning liquid L on the surface to be treated of the substrate W through the recovery opening surface 9a.

Further, in this embodiment, since the ultrasonic oscillation application unit for applying ultrasonic oscillation to the treatment liquid L on the substrate W is interposed between the introduction opening surface 8a and the recovery opening surface 9a of the cleaning nozzle 1, ultrasonic oscillation can be applied to the treatment liquid L on the surface to be treated of the substrate W, whereby the cleaning efficiency can be improved.

Further, the oxidation-reduction potential and the pH of the treatment liquid L are controlled in this embodiment. Thus, the composition and the concentration of the treatment liquid L can be maintained optionally. As a result, even a small flow rate of the cleaning liquid L can secure a sufficient treatment efficiency.

Further, in the cleaning nozzle 1 used in the cleaning apparatus of this embodiment, the cleaning liquid L is fed onto the substrate W through the multiplicity of through holes in the cleaning liquid feed member 12 (composed of the porous material) without directly dropping thereon from the introduction flow path 31. As a result, the cleaning liquid L is approximately uniformly fed from the entire surface of the cleaning liquid feed member 12 facing the substrate W, so that the cleaning liquid L is uniformly and promptly fed to an area having a certain degree of wideness on the substrate W at an approximately uniform flow velocity. Then, the cleaning liquid L is approximately uniformly recovered from the entire surface, which faces the substrate W, of the cleaning liquid recovery member 13 having the plurality of through holes. Almost no liquid reservoir is caused in the cleaning nozzle 1 of this embodiment by the actions of both the cleaning liquid feed member 12 and the cleaning liquid recovery member 13, whereby no particle stays on the substrate W and the cleaning efficiency can be improved.

Further, when the cleaning liquid feed member 12 and the cleaning liquid recovery member 13 are formed of the hydrophilic material, the cleaning liquid L can be easily distributed to the overall space between the cleaning liquid feed member 12, the cleaning liquid recovery member 13 and the substrate W, which permits the cleaning liquid L to be promptly fed onto the substrate W and to be promptly recovered therefrom. With this arrangement, the cleaning efficiency can be more improved.

Second Embodiment

A second embodiment of the present invention will be described below with reference to FIGS. 11 and 12.

The overall arrangement of a cleaning apparatus of this embodiment is substantially the same as that of the cleaning apparatus according to the first embodiment shown in FIG. 1 except that a cleaning nozzle 15 is used in place of the cleaning nozzle 1.

Further, the basic arrangement of the cleaning nozzle 15 is similar to that of the cleaning nozzle 1 in the first embodiment except that a layer composed of a hydrophobic material is added to the cleaning nozzle 1. The components in FIGS. 11 and 12, which are common to those of FIGS. 3 and 4, are therefor denoted by the same reference numerals and a detailed description thereof is omitted.

Figure 11:
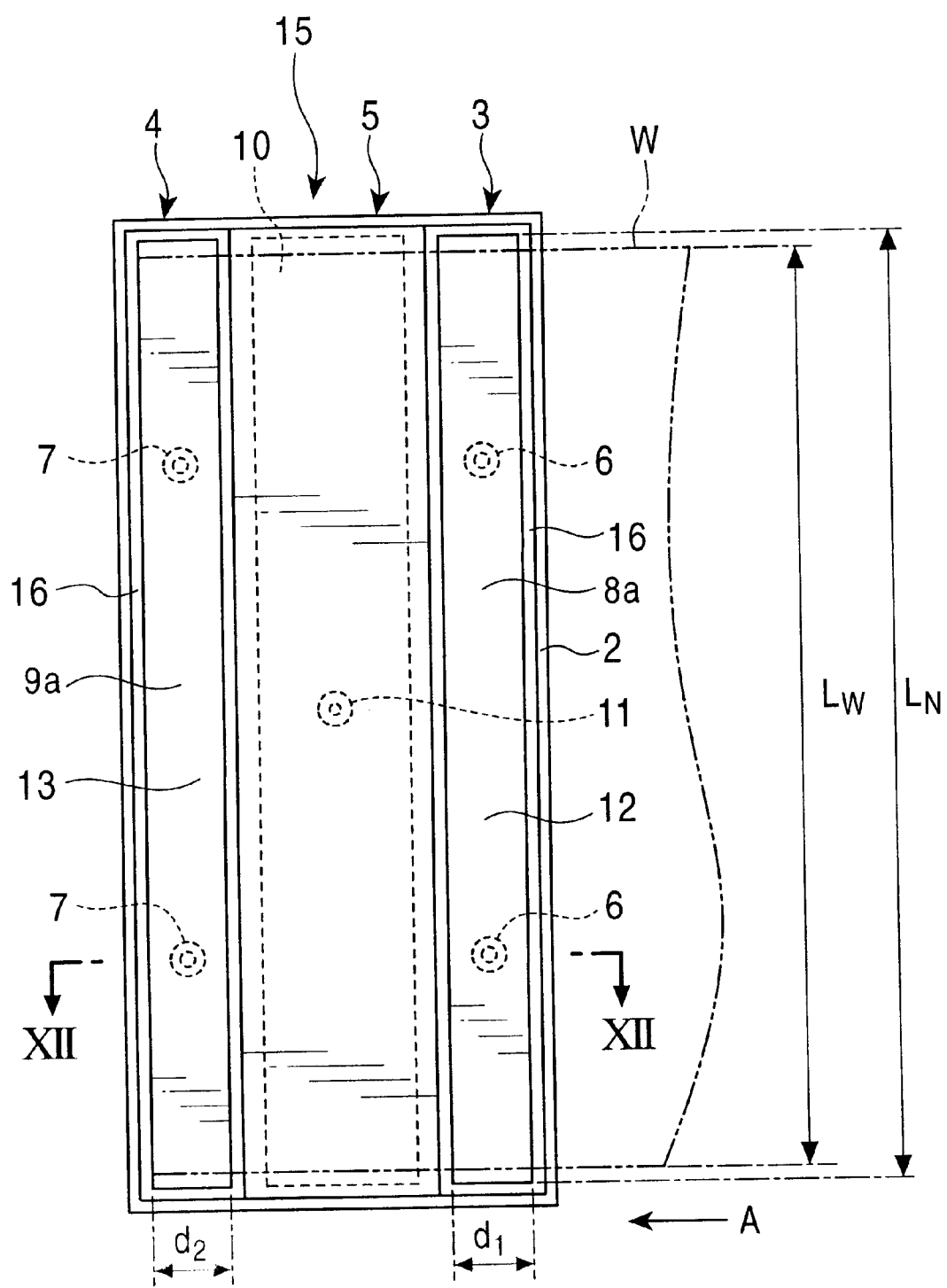
FIG. 11 is lower plan view showing a cleaning nozzle of a second embodiment of the present invention.
Figure 12:
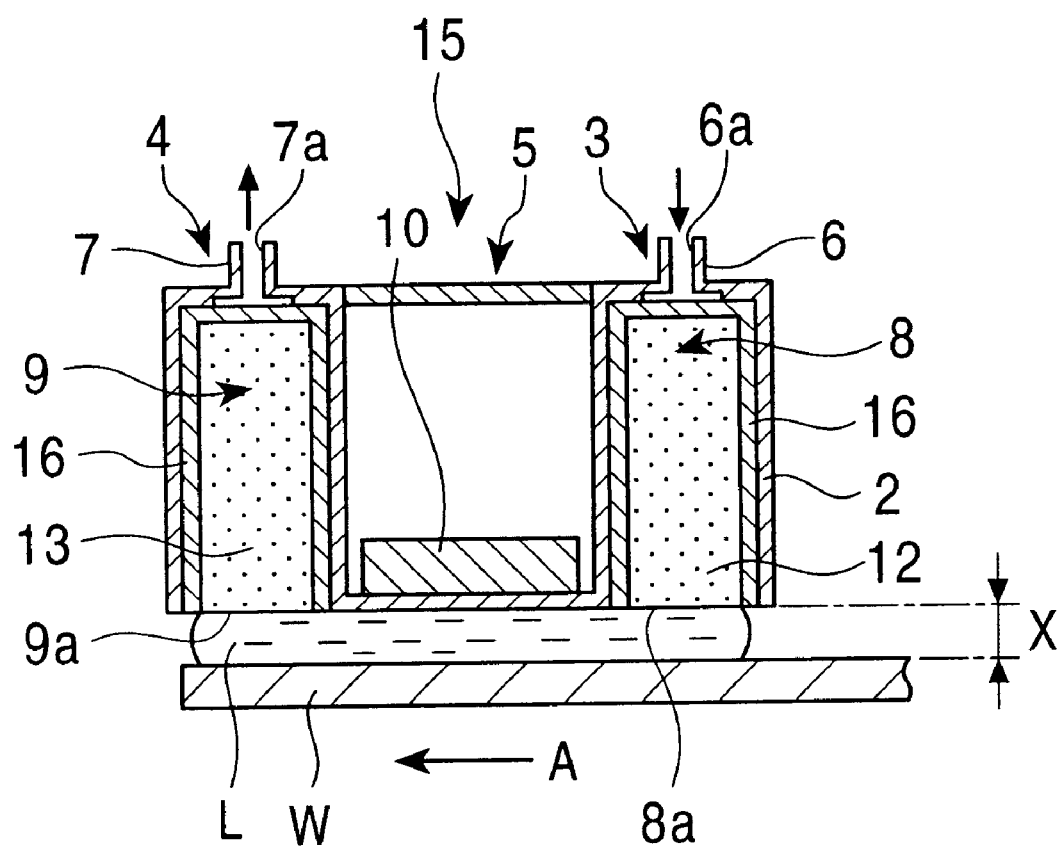
FIG. 12 is a sectional view taken along the line XII—XII of FIG. 11.

In the cleaning nozzle 15 of this embodiment, the periphery of a cleaning liquid feed member 12 and the periphery of a cleaning liquid recovery member 13 are each covered with hydrophobic layers 16 composed of a hydrophobic material as shown in FIGS. 11 and 12. Teflon resin, silicone resin, polyethylene resin, etc., for example, can be used as the hydrophobic material. In this case, an introduction opening surface 8a and a recovery opening surface 9a are portions which are surrounded with the lower ends of the hydrophobic layers 16. While the entire peripheries of the cleaning liquid supply member 12 and the cleaning liquid recovery member 13 are covered with the hydrophobic layers 16 in this embodiment, the entire peripheries need not be necessarily covered with the hydrophobic layers 16, and it is sufficient to cover the ends of these members 12 and 13 on the sides thereof facing the substrate W with the hydrophobic layers 16.

The cleaning apparatus of this embodiment can achieve an operation/working effect similar to that of the first embodiment as to the uniform distribution of the cleaning liquid L. Further, since the wettability of the cleaning liquid L is reduced in the peripheries of the introduction opening surface 8a and the recovery opening surface 9a, which are open to the atmosphere as an effect of the addition of the layer composed of the hydrophobic material to the cleaning nozzle 15, the cleaning liquid L is kept between the cleaning nozzle 15 and the substrate W so as to rise therebetween. As a result, the flow of the cleaning liquid L, which tends to leak to the outside of the cleaning nozzle 15 from the introduction opening surface 8a and the recovery opening surface 9a, which are open to the atmosphere, can be suppressed. Therefore, controllability as to the keeping of the cleaning liquid L is greatly improved so that the cleaning liquid L can be reliably prevented from leaking to the outside of the cleaning nozzle 15.

While the above respective embodiments are arranged as a cleaning apparatus, the wet treatment apparatus of the present invention can also be arranged as various types of wet treatment apparatuses used for etching, development, exfoliation, plating, and the like.

While the workpiece to be treated is disposed below the cleaning liquid nozzle in the above respective embodiments, the positional relationship between the nozzle and the workpiece to be treated is not so limited, and the workpiece to be treated may be for example, disposed above the nozzle with the introduction opening surface and the recovery opening surface thereof facing upward.

Further, in the above respective embodiments, while the opening side end surfaces of the introduction opening and the recovery opening of an approximate cuboid are arranged as the introduction opening surface and the recovery opening surface, respectively, the specific shape of the nozzle is not particularly limited except that the respective opening surfaces are formed in an approximate rectangle. Further, the position where the treatment liquid is fed to the nozzle and the position from which it is recovered are not particularly limited, and the introduction pipes and the recovery pipes may, for example, be disposed on a side of the nozzle.

Experiment

A relationship between the flow rate and the cleaning effect was examined using the apparatus of the second embodiment. Conditions employed in an experiment were as described below.

(1) A glass substrate of 550 mm×650 mm (thickness: 0.7 mm), the surface of which was forcibly polluted with alumina particles (particle size: 0.1 to 2.0 μm), was used as a substrate to be treated (workpiece to be treated). Specifically, alumina particles were dispersed in a minute amount of IPA (isopropyl alcohol) and thereafter dispersed in pure water and sprayed with a sprayer. The glass substrate was dried with a nitrogen gas sprayed thereon. Then, glass substrates polluted with particles of about 100,000 pieces/substrate each having a particle size of at least 0.5 μm were used as substances to be treated.

(2) The introduction opening surface and the recovery opening surface were each formed in a rectangular shape having a long side of 600 mm and a short side of 10 mm.

(3) The cleaning liquid feed member and the cleaning liquid recovery member were composed of a porous ceramic material, the periphery of which was covered with fluorine resin acting as a hydrophobic material.

(4) The moving speed of the substrate was set to 20 mm/sec.

(5) The distance between the introduction opening surface and recovery opening surface and the substrate was set to 3 mm.

(6) Ultrasonic oscillation of 1 MHz was applied by an ultrasonic oscillator.

(7) Ammonia water containing hydrogen gas dissolved therein was used as a cleaning liquid, the ammonia water being controlled to have pH of about 10 and an oxidation-reduction potential of −580 mV so that the concentration of ammonia was set to about 40 ppm and the concentration of hydrogen gas was set to about 1.3 ppm.

(8) The flow rate of the cleaning liquid was varied in the range from 0.01 to 0.5 L/min per 1 cm in the long side direction of the introduction opening surface.

(9) An air knife was used to dry the substrate after it was cleaned.

Figure 13:
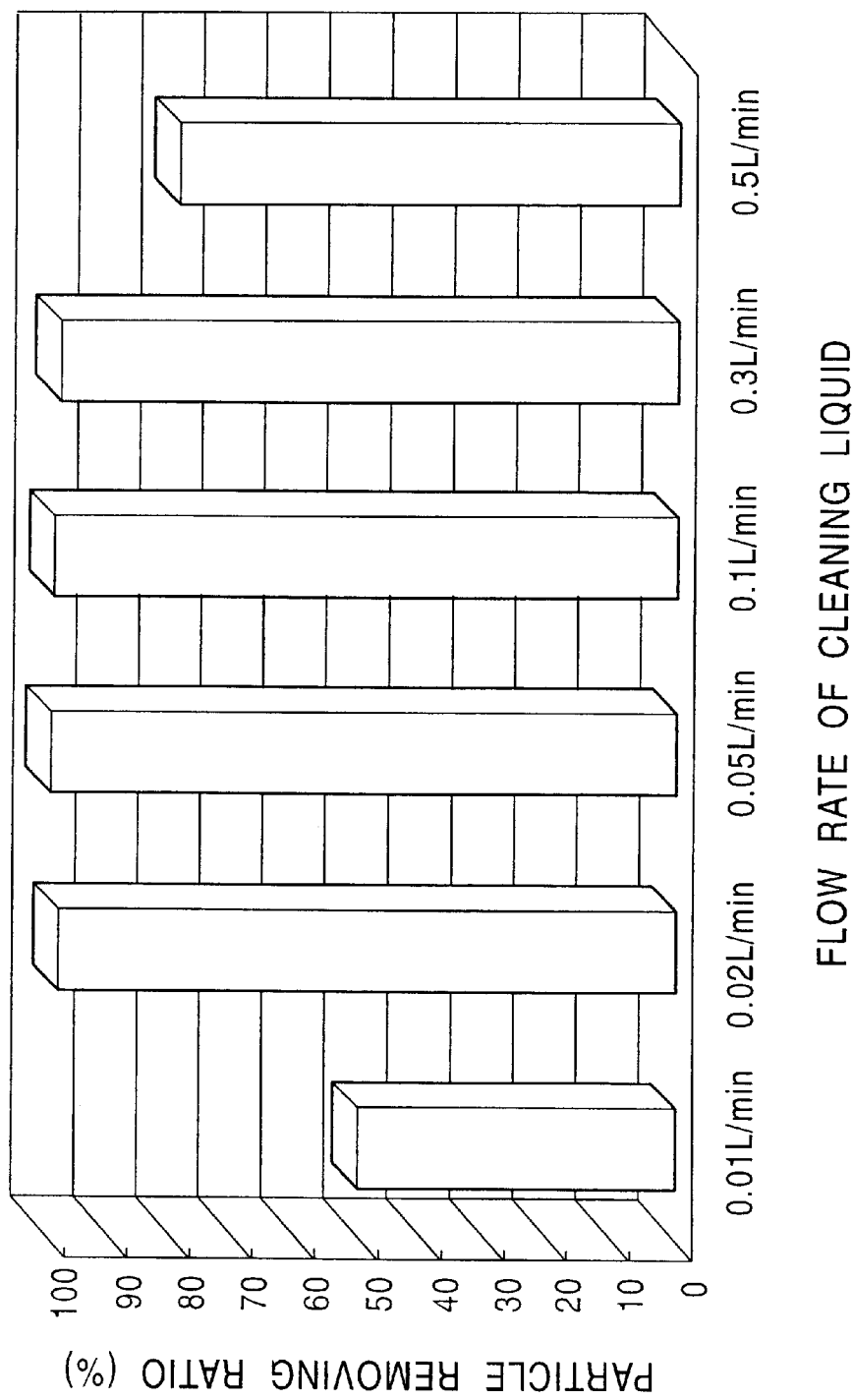
FIG. 13 is a graph showing a result of an experiment as to a flow rate and a cleaning effect.

FIG. 13 shows a result of the above experiment. As shown in FIG. 13, when the flow rate of the cleaning liquid L was 0.01 L/min, the quantity of the cleaning liquid was too small to sufficiently remove particles. In addition, a flow rate of the cleaning liquid of 0.5 mL/min could also not sufficiently remove particles. It appears that this is because the cleaning liquid could not be fed in a state in which it was properly controlled in one direction and particles were redeposited on the substrate.

In contrast, particles could be sufficiently removed at a flow rate of 0.02 to 0.3 L/min. It appears that this is because the cleaning liquid could be sufficiently distributed to the surface of the substrate, and could be sufficiently replaced by the steady flow thereof.

Note that while the wet treatment for cleaning particles was executed in this embodiment, it is important that the treatment liquid be sufficiently distributed to a surface to be treated as well as be sufficiently replaced. Accordingly, the optimum flow rate of 0.02 to 0.3 L/min per 1 cm in the long side direction of the introduction opening surface is also applicable to the case of other wet treatment apparatuses.

As described above in detail, the present invention has clarified the appropriate conditions to be applied when a liquid saving type wet treatment apparatus is put into operation. Accordingly, effective and efficient wet treatment can be realized by providing a wet treatment apparatus which can be operated under these optimum conditions.

What is claimed is:

1. A wet treatment apparatus, comprising:
a nozzle having an approximately rectangular introduction opening surface that is open toward a workpiece to be treated, and an approximately rectangular recovery opening surface that is open toward the workpiece, the introduction opening surface and the recovery opening surface being flush with each other and disposed with long side directions thereof in parallel with each other;
a treatment liquid introduction apparatus having an introduction flow path for introducing a treatment liquid between the introduction opening surface and the surface to be treated of the workpiece;
a treatment liquid recovery apparatus having a suction pump and a recovery flow path for sucking and recovering the treatment liquid from between said recovery opening surface and the surface to be treated of the workpiece; and
a moving mechanism for the nozzle or the workpiece for moving said nozzle and the workpiece relative to each other along the surface to be treated of the workpiece in a short side direction of said introduction opening surface and said recovery opening surface,
wherein a flow rate of the treatment liquid flowing from said introduction opening surface to said recovery opening surface via the surface to be treated of the workpiece is controlled to 0.02 to 0.3 L/min per 1 cm in the long side direction of said introduction opening surface.

2. A wet treatment apparatus according to claim 1, wherein the flow rate is controlled by regulating the sectional area of said introduction flow path or said recovery flow path.

3. A wet treatment apparatus according to claim 1, wherein the long sides of said introduction opening surface and said recovery opening surface have lengths that are equal to or larger than a width of the workpiece said width being in a direction parallel to the long sides.

4. A wet treatment apparatus according to claim 1, wherein a relative moving speed due to said moving mechanism is 0.5 to 20 cm/sec.

5. A wet treatment apparatus according to claim 1, wherein the distance between said introduction opening surface and said recovery opening surface, and the surface to be treated of the workpiece is 0.5 to 6 mm.

6. A wet treatment apparatus according to claim 1, wherein the short sides of said introduction opening surface and said recovery opening surface each have a length of 0.01 to 2 cm.

7. A wet treatment apparatus according to claim 1, wherein an ultrasonic oscillation mechanism is interposed between said introduction opening surface and said recovery opening surface to apply ultrasonic oscillation to the treatment liquid on the workpiece.

8. A wet treatment apparatus according to claim 1, further comprising an oxidation-reduction potential control means for controlling the treatment liquid.

9. A wet treatment apparatus according to claim 1, further comprising a pH control means for controlling the treatment liquid.

\* \* \* \* \*